United States Patent [19]
Fujisawa

[11] Patent Number: 5,809,284
[45] Date of Patent: Sep. 15, 1998

[54] EFFECTIVE BLOCK EXTRACTION UNIT AND METHOD, AND A CIRCUIT SIMULATOR

[75] Inventor: Hisanori Fujisawa, Kanagawa, Japan

[73] Assignee: Fujitsu Limited, Kawasaki, Japan

[21] Appl. No.: 548,134

[22] Filed: Oct. 25, 1995

[30] Foreign Application Priority Data

Apr. 14, 1995 [JP] Japan ................................. 7-088958

[51] Int. Cl.⁶ .......................... G06F 9/455; G06F 17/50
[52] U.S. Cl. ........................................................ 395/500
[58] Field of Search ................................ 364/488–491, 364/578; 395/500

[56] References Cited

U.S. PATENT DOCUMENTS

| | | | |
|---|---|---|---|
| 5,305,229 | 4/1994 | Dhar | 364/489 |
| 5,379,231 | 1/1995 | Pillage et al. | 364/488 |
| 5,384,720 | 1/1995 | Ku et al. | 364/578 |
| 5,508,937 | 4/1996 | Abato et al. | 364/488 |
| 5,596,505 | 1/1997 | Steiweg et al. | 364/490 |

Primary Examiner—Kevin J. Teska
Assistant Examiner—Ayni Mohamed
Attorney, Agent, or Firm—Armstrong, Westerman, Hattori, McLeland & Naughton

[57] ABSTRACT

Paths from a block that includes the node that is the object of analysis to another block are searched for by a path search section for all blocks in a circuit; and a depth judgment section finds the depth of each block from that path search information. An effective block judgment section compares the depth of each block to a specified depth that is stored in a specified depth storage section, and judges which blocks are effective blocks. Thus, blocks that include nodes that exert influence on the simulation accuracy at the node that is the object of analysis are extracted from the circuit that is the object of simulation as effective blocks. Then, in the circuit simulation, events are generated only for the effective blocks, and a transient analysis simulation is executed by the event-driven method. This permits the processing speed of the simulation to be increased while maintaining accuracy.

11 Claims, 15 Drawing Sheets

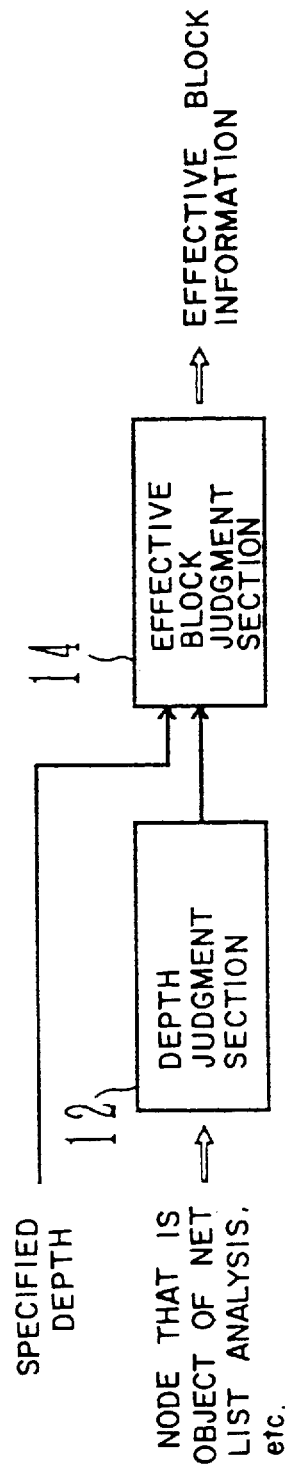
F I G. 1

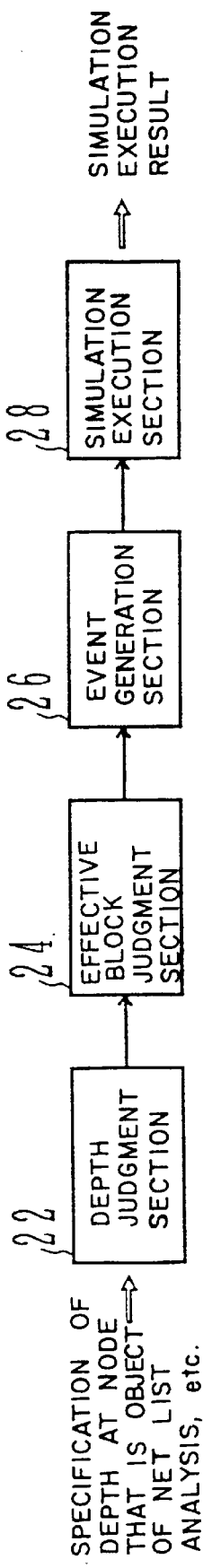
F I G. 3

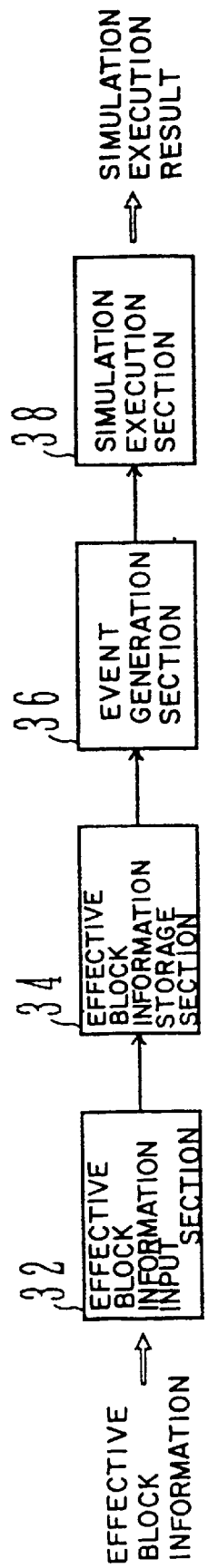
F I G. 4

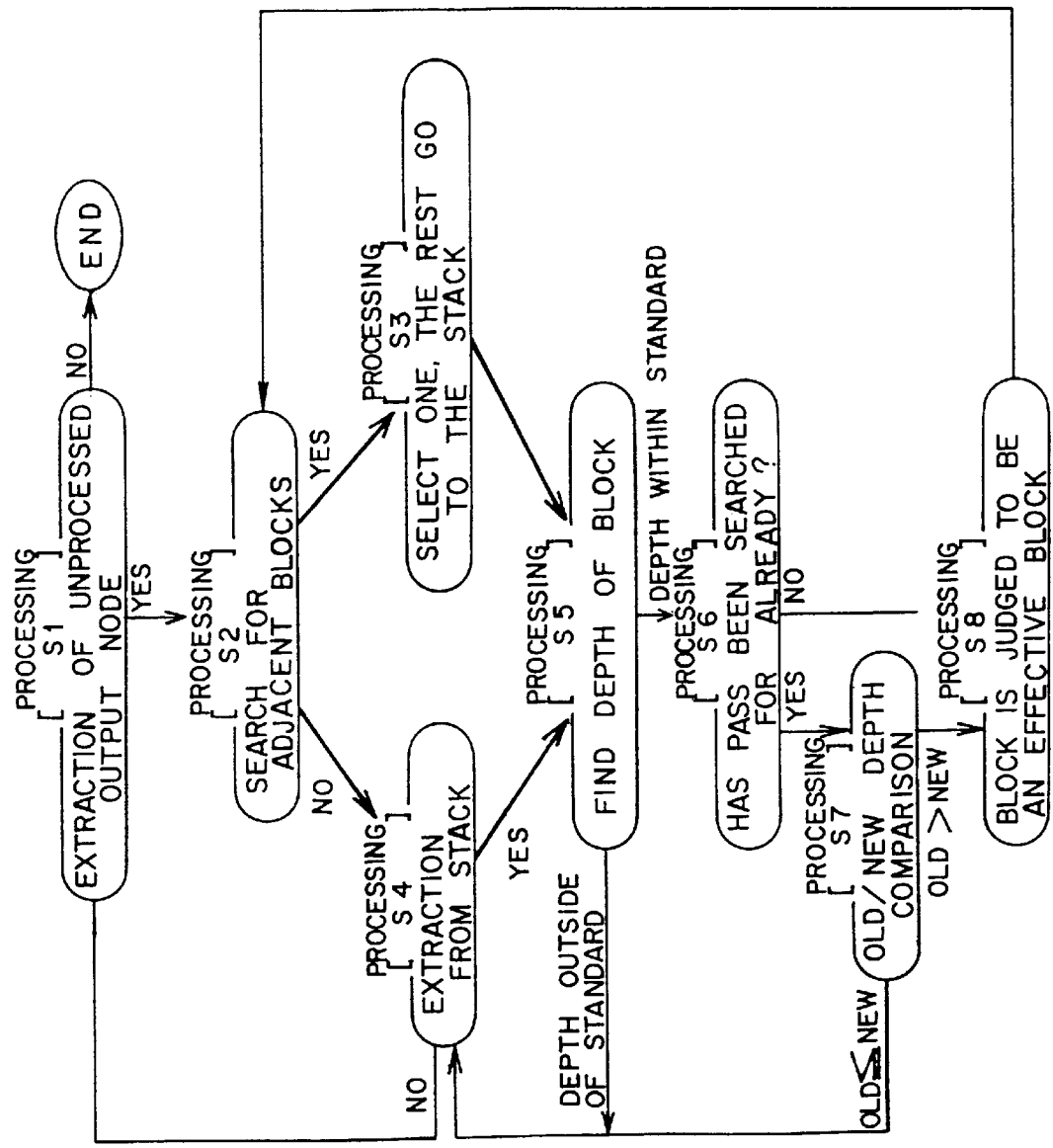
F I G. 10

EFFECTIVE BLOCK EXTRACTION UNIT AND METHOD, AND A CIRCUIT SIMULATOR

BACKGROUND OF THE INVENTION

1. Field of the Invention

This invention relates to circuit simulation to support design of large-scale integrated electronic circuits (referred to as LSIs below); in particular, to circuit simulation that is effective in transient analysis.

2. Description of the Related Art

At present, circuit simulation has become necessary and indispensable in LSI circuit design. Recently, with LSIs becoming larger in scale and demands for shortening of the design time, technology that can perform simulation for transient analysis of circuits at high speed has become necessary.

In the past, in LSI circuit design, for example circuit simulation by implicit calculation methods typified by SPICE have been known. However, in these methods, as the circuits become larger in scale, problems with limits on circuit size and processing speed have surfaced. To deal with these problems, increasing the speed of calculation by limiting the number of relaxation iterations, to make use of the multi-rate property, and relaxation methods, have been developed. However, the former method has run into trouble from the points of view of accuracy and reliability. Meanwhile, in the latter method, there are problems with efficiency, for example a great many iterations are required before a circuit stabilizes by relaxation.

There has also been a great deal of development of circuit simulators using explicit calculation methods aimed at increasing processing speed. However, although these methods have produced great increases in processing speed, there are problems with accuracy, making it impossible, for example, for them to handle complicated transistor models, and in some cases there are also problems with stability.

As explained above, in past simulators, in transient analysis of LSIs there is the problem that it has not been possible to satisfy accuracy and increase speed at the same time. For this reason, the present inventor has in the past principally worked on developing event-driven type circuit simulators designed for MOS circuits. These simulators divide a circuit into a number of partial circuits (referred to hereafter as blocks), and events can be transferred among the blocks. Characteristics of this type of simulator are that predicted potential type calculations rather than relaxed iteration calculations are used as the implicit calculation method used in a general purpose circuit simulator, and that events are used as signals to transmit changes in predictive potential.

However, in an event-driven type circuit simulator, if it is desired to investigate the output at a specified node, it has been necessary either to execute the simulation for the entire circuit, or first manually cut out as much of the entire circuit as is necessary and then execute the simulation on that part. For this reason, there are problems such as that the simulation takes a great deal of time and a great deal of time is required for the troublesome task of cutting part of the circuit out by hand. In addition, even if the circuit part is cut out, since all that has been done is to search for the path in the fan-in direction and then cut the circuit out on that path, it is not possible adequately to consider the effect of fan-out, causing an error to occur between the predicted potential and the actual potential at a node.

SUMMARY OF THE INVENTION

Consequently, an object of this invention is to realize a circuit simulation that can simulate the node that is the object of analysis accurately and at high speed while adequately considering the effect of fan-out.

The first invention presupposes the availability of an effective block extraction unit that extracts the effective block that is the object of transferring of events from the circuit that is the object of the simulation in an event-driven type circuit simulation.

Each block in the circuit has:

a depth judgment unit that finds the depth of the fan-out level with respect to the block that is the object of analysis and includes the node that is the object of analysis, as the depth; and an effective block judgment unit that compares the depth of each block found by the depth judgment unit to a specified regulation depth, and judges blocks that exert an effect at or above a specified level on the accuracy of simulation of the node that is the object of analysis to be effective blocks.

The depth judgment unit, in turn, has:

a path search unit that searches for all paths that connect the blocks within the circuit, with, for example, the block that is the object of analysis as the starting point; and a depth calculation unit that finds the depth with respect to the block that is the object of analysis for all blocks in the circuit based on the path information obtained by the path search unit.

The depth calculation unit computes the number of connecting paths among the blocks in the direction from fan-in to fan-out, included in, for example, the path that extends from the block that is the object of analysis to a block that is the object of a depth determination; and takes that number to be the depth of the object block.

In addition, if, for example, there are a plurality of paths extending from the block that is the object of analysis to the block that is the object of depth determination, and a plurality of numbers of connecting paths among blocks in the direction from fan-in to fan-out have been found, the depth computation unit takes the smallest number as the depth.

The effective block extraction method, which is the second invention, includes:

a step in which the depth of the fan-out level with respect to the block that is the object of analysis, including the node that is the object of analysis, is found as the depth for each block in the circuit; and a step in which the depth of each block found by the depth judgment unit is compared to a specified regulation depth, and blocks which exert an effect at or above a specified level on the simulation accuracy at the node that is the object of analysis are judged to be effective blocks.

The third invention presupposes the availability of a circuit simulator that executes circuit simulations by the event-driven method.

This circuit simulator has:

a depth judgment unit that finds the depth of the fan-out level with respect to the block that is the object of analysis including the node that is the object of analysis, as the depth, for each block in the circuit; and an effective block judgment unit that compares the depth of each block found by the depth judgment unit to a specified regulation depth, and judges blocks the effect of which on the accuracy of the simulation at the node that is the object of analysis is at or above the specified level to be effective blocks; and an event generation unit that generates events only for blocks that have been judged to be effective blocks by the effective block judgment unit; and a simulation execution unit that executes circuit simulations based only on the events generated by the event generation unit.

The fourth invention presupposes the availability of a circuit simulator that executes circuit simulations by the event-driven method.

This circuit simulator has:

an effective block information input unit that inputs information relating to the effective blocks the effect of which on the accuracy of the simulation at the node that is the object of analysis is at or above a specified level; and an effective block information storage unit that stores information on the effective blocks that has been input through the effective block information input unit; and an event generation unit that generates events only for effective blocks for which information is stored in the effective block information storage unit; and a simulation execution unit that executes circuit simulations based only on the events generated by the event generation unit.

BRIEF DESCRIPTION OF THE DRAWINGS

FIG. 1 shows a diagram explaining the principle of the first effective block extraction unit of this invention;

FIG. 3 shows a diagram explaining the principle of the second effective block extraction unit of this invention;

FIG. 4 shows a diagram explaining the principle of the third effective block extraction unit of this invention;

FIG. 10 shows a flow chart explaining the action of the effective block extraction unit shown in FIG. 5;

DESCRIPTION OF THE PREFERRED EMBODIMENTS

FIG. 1 is a schematic diagram explaining the principle of the first effective block extraction unit which is the first invention.

This first effective block extraction unit has the following constituent elements.

The depth judgment section 12 finds the depth of the fan-out level with respect to the block that is the object of analysis, including the node that is the object of analysis, as the depth for each block in the circuit.

The effective block judgment section 14 compares the depth of each block found by the depth judgment section 12 to a specified standard depth (the specified depth), and judges those blocks the effect of which on the accuracy of the simulation at the node that is the object of analysis is at or above the specified level to be effective blocks.

The depth judgment section 12 has, for example, a path search section that searches for all paths connecting the blocks in the circuit with the block that is the object of analysis as the starting point, and a depth computation section that finds the depth with respect to the block that is the object of analysis for all blocks in the circuit based on the path information obtained by the path search section.

The depth computation section, for example, computes the number of connecting paths among blocks in the direction from fan-in to fan-out among the paths that extend from the block that is the object of analysis to the block that is the object of depth determination, and takes that number to be the depth of the object block. If a plurality of paths from the block that is the object of analysis to the block that is the object of depth determination exist, and a plurality of numbers of connecting paths among the blocks in the direction from fan-in to fan-out are found, then the smallest number is taken as the depth.

Next, let us explain the action of this first effective block extraction unit.

The depth judgment section 12 finds the depth of the fan-out level for the block that is the object of analysis including the node that is the object of analysis, with respect to each block in the circuit, as the depth. Then the effective block judgment section 14 compares the depth of each block found by the depth judgment section 12 to a specified standard depth, and judges those blocks that have an effect on the accuracy of the simulation at the node that is the object of analysis that is at or above the specified level to be effective blocks.

Consequently, it is possible to extract only those blocks that have a deep influence on the simulation accuracy at the node that is the object of analysis from the circuit that is the object of simulation.

Figure 2:
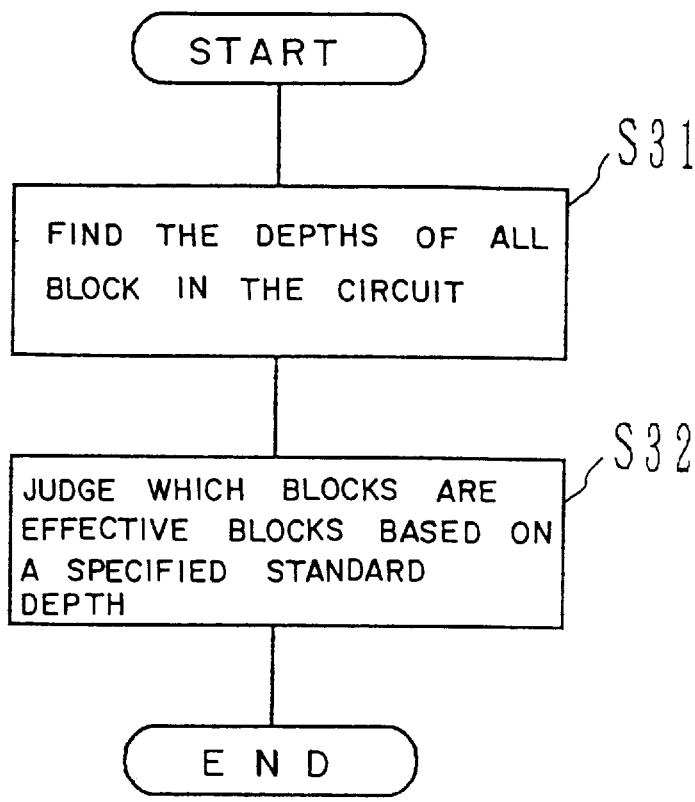
FIG. 2 shows a diagram explaining the principle of the effective block extraction method of this invention.

FIG. 2 is a flow chart that explains the effective block extraction method that is the second invention.

In this effective block extraction method, first the depth of the fan-out level with respect to the block that is the object of analysis including the node that is the object of analysis is found for each block in the circuit as the depth (step S31).

Next, the depth of each block that has been found as described above is compared to a specified standard depth, and those blocks that exert an influence on the accuracy of the simulation at the node that is the object of analysis at or above the specified level are judged to be effective blocks (step S32).

In this method, first the depth of the fan-out level with respect to the block that is the object of analysis including the node that is the object of analysis is found for each block in the circuit as the depth. Then the depth of each of the blocks is compared to the specified standard depth, and those blocks that have an influence on the simulation accuracy at the node that is the object of analysis that is at or above the specified level are judged to be effective blocks.

Consequently, in the same manner as in the first effective block extraction unit, it is possible to extract only those blocks that exert a deep influence on the simulation accuracy at the node that is the object of analysis from the circuit that is the object of simulation as effective blocks.

FIG. 3 is a diagram that explains the principle of the second effective block extraction unit that is the third invention. This second effective block extraction unit presumes the availability of a circuit simulator that executes circuit simulations by the event-driven method, and includes the constituent elements listed below.

The depth judgment section 22 finds the depth of the fan-out level with respect to the block that is the object of analysis including the node that is the object of analysis for each block in the circuit as the depth.

The effective block judgment section 24 compares the depth of each block found by the depth judgment section 22 to a specified standard depth, and judges those blocks that have an influence on the simulation accuracy at the node that is the object of analysis that is at or above the specified level to be effective blocks.

The event generation section 26 generates events for only those blocks judged to be effective blocks by the effective block judgment section 24.

The simulation execution section 28 executes the circuit simulation based only on the events generated by the event generation section 26.

Next, let us explain the action of this second effective block extraction unit.

In this second effective block extraction unit, first the depth judgment section 22 finds the depth of the fan-out level with respect to the block that is the object of analysis including the node that is the object of analysis for each block in the circuit as the depth.

Next, the effective block judgment section 24 compares the depth of each block found by the depth judgment section 22 to a specified standard depth, and judges those blocks that have an influence on the simulation accuracy at the node that is the object of analysis that is at or above the specified level to be effective blocks.

The event generation section 26 generates events only for those blocks judged to be effective blocks by the effective block judgment section 24. Then the simulation execution section 28 executes the circuit simulation based only on the events generated by the event generation section 26.

Consequently, events are generated only for effective blocks that exert an influence on the simulation accuracy at the node that is the object of analysis that is at or above the specified level. For example, it becomes possible to simulate the rises, falls, and delay time, etc. of the output potential waveform for a time-varying step input signal at the node that is the object of analysis accurately and at high speed.

Next, FIG. 4 is a diagram that explains the principle of the effective block extraction unit that is the fourth invention.

This third effective block extraction unit, like the second effective block extraction unit described above, presupposes the availability of a circuit simulator that executes circuit simulations by the event-driven method, and has the following constituent elements.

The effective block information input section 32 accepts input of information relating to effective blocks that have an influence on the simulation accuracy at the node that is the object of simulation at or above the specified level.

The effective block information storage section 34 stores the effective block information input via the effective block information input section 32.

The event generation section 36 generates events only for effective blocks information on which is stored in the effective block information storage section 34.

The simulation execution section 38 executes circuit simulations based only on the events generated by the event generation section 36.

Next, let us explain the action of this third effective block extraction unit.

In this third effective block extraction unit, first the effective block information input section 32 accepts input of information relating to the effective blocks that have influence on the simulation accuracy at the node that is the object of analysis that is at or above a specified level. Then the effective block information input via the effective block information input section 32 is stored in the effective block information storage section 34.

The event generation section 36 generates events only for the effective blocks for which information is stored in the effective block information storage section 34. Then the simulation execution section 38 executes the circuit simulation based only on the events generated by the event generation section 36.

Consequently, as in the case of the second effective block extraction unit described above, it becomes possible to simulate the rises, falls, time delays, etc. of the output potential waveform at the node that is the object of analysis accurately and at high speed.

Next, let us explain some good embodiments of this invention.

Figure 5:
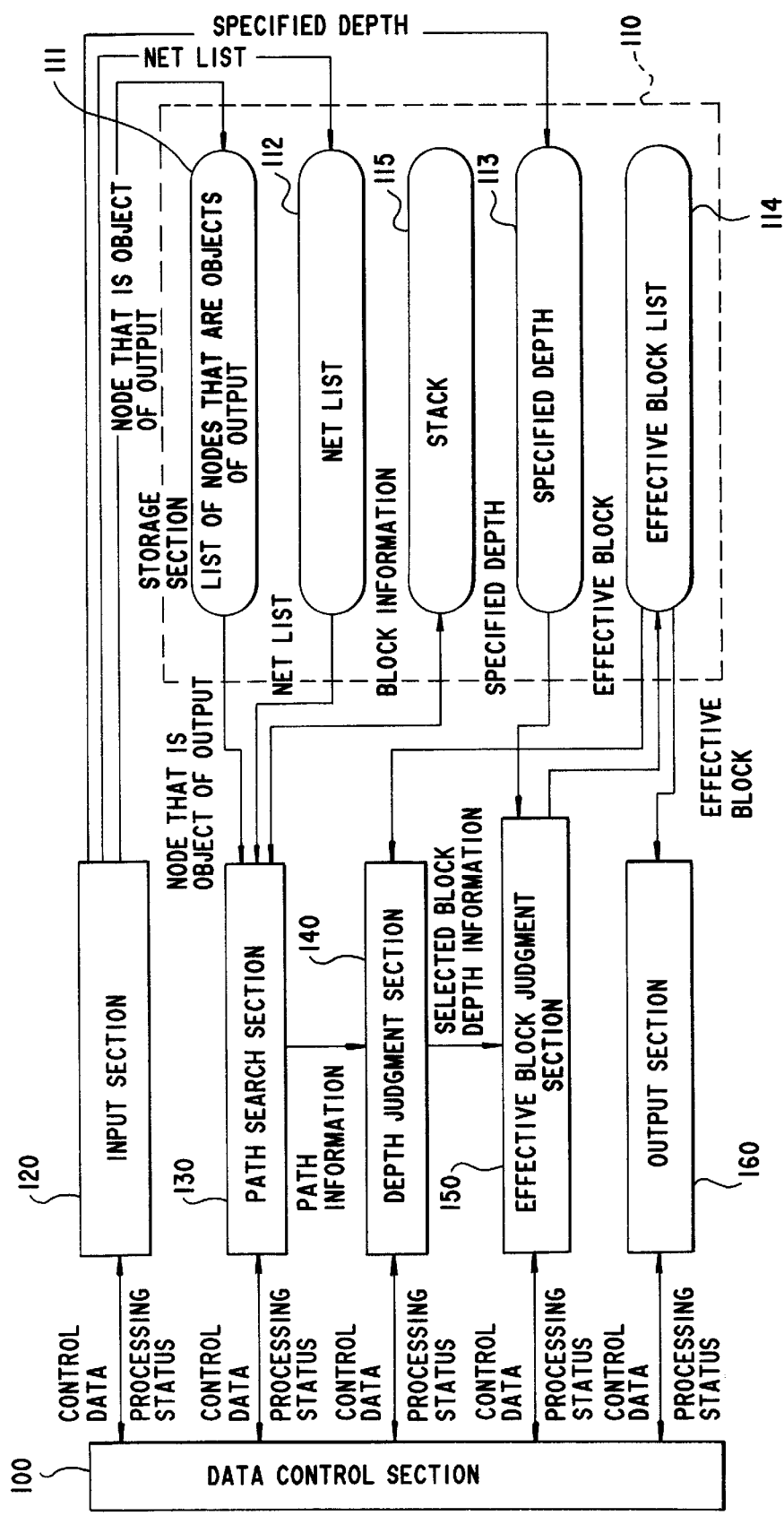
FIG. 5 shows a block diagram showing the system configuration of an effective block detection unit that is one embodiment of this invention.

FIG. 5 is a block diagram showing the system configuration of an effective block detection unit that is one embodiment of this invention.

The data control section 100 is a block that controls the execution of each block in the system.

The memory section 110 has an output object node list storage section 111, a net list storage section 112, a specified depth storage section 113, an effective block list storage section 114 and a stack 115.

The output object node list storage section 111 stores the output nodes that are the object of the simulation.

The net list storage section 112 stores the net list information for the circuit to be simulated.

The specified depth storage section 113 stores the depth that is the judgment standard for effective blocks (the specified depth). A block is only an effective block when it is necessary for the analysis of a node for which an analysis is actually to be performed. The depth is defined as follows. When the path from the block for which the depth is to be found to the specified block that is the object of analysis is followed from the specified block, the depth is found as the number of times the path that connects blocks adjacent to the path (the connecting path) passes through in the direction of the signal. In other words, it is the number of connecting paths in the fan-out direction in the path from the block of which the depth is being found to the specified block that is the object of analysis. The depth is also called the "fan-out level depth". A plurality of depths may be found for one block, for example when there are a plurality of paths and when there are a plurality of blocks that are the object of analysis. In such a case, the smallest depth is taken as the depth of that block.

Figure 6:
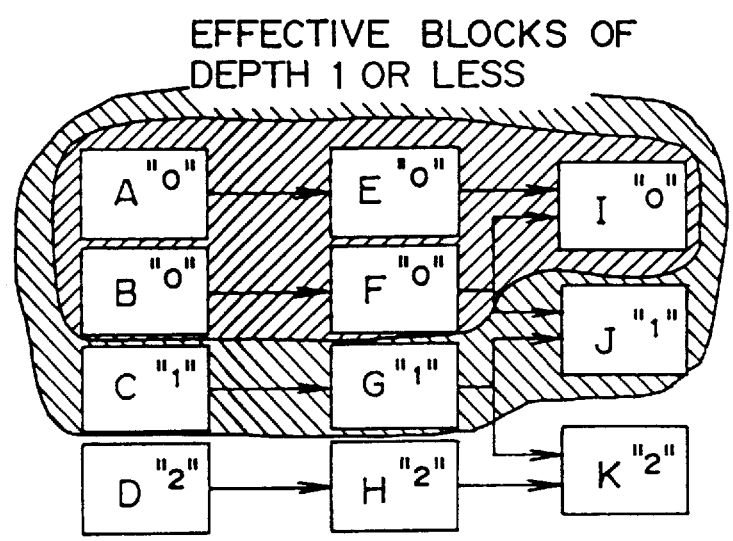
FIG. 6 shows a diagram explaining the definition of depth.

The depth will now be explained with reference to FIG. 6. In this figure, the number in quotation marks ( " ) at the upper right of each block is the depth of the block.

In this figure, block I is taken to be the block that is the object of analysis including the node that is the object of analysis. At this time, the path from block C to the block I that is the object of analysis is I–F–J–G–C. Within this path, the signal only propagates in the forward direction (the fan-out direction) from F to J. Consequently, the depth of block C is "1". Similarly, blocks A, B, E and F have depth "0"; blocks C, G and J have depth "1"; blocks D, H and K have depth "2".

In this embodiment, blocks that have depth equal to or less than the specified depth are extracted as effective blocks. This is because although, in a MOS transistor, the source and the drain have almost no effect with respect to the gate, since the gate has capacitance, they do have an effect, although it is slight, on the gate potential. For this reason, it is not sufficient to select only the blocks on the fan-in side (the blocks of depth "0"); it is also made possible to select effective blocks considering the effect from the fan-out by specifying the specified depth in accordance with the required precision.

The effective block list storage section 114 stores the list of blocks that are judged to be effective blocks in the circuit that is the object of analysis.

The stack 115 is a memory that uses an LIFO (Last In First Out) method for the work area in path search processing for the purpose of searching for the effective block list.

The input section 120 is a unit used for the user to input the list of nodes that are the object of output, the net list and the specified depth from outside. This input information is stored in the output object node list storage section 111, the net list storage section 112 and the specified depth storage section 113, respectively.

The path search section 130 receives control from the data control section 100 and then executes the following processing.

(1) When not even the name of one block is stored in the stack 115, fetches a node from the output object node list storage section 111, based on the net list stored in the net list storage section 112, and lists all adjacent blocks connected to this node. Then only one block is selected from these adjacent blocks; its name is transferred to the depth judgment section 140, and at the same time the remaining blocks are stacked in the stack 115.

(2) Blocks adjacent to the block received from the effective block judgment section 150 are listed up based on the net list. Then from among these one block is selected and transferred to the depth judgment section 140. In addition, the remaining blocks are stacked in the stack 115.

(3) Blocks are successively fetched from the stack 115; the names of those fetched blocks are transferred to the depth judgment section 140.

The depth judgment section 140 judges the depth of the block received from the path search section 130 (the selected block). Then that depth information is output to the effective block judgment section 150.

The effective block judgment section 150 compares the depth information on the selected block received from the depth judgment section 140 to the specified depth stored in the specified depth storage section 113. Then, when it is judged that the selected block is an effective block, its name is stored in the effective block list storage section 114.

The output section 160 fetches names of blocks judged to be effective blocks from the effective block list storage section 114, and outputs them to the outside.

Next, let us explain the circuit division method used in this embodiment.

Figure 7:
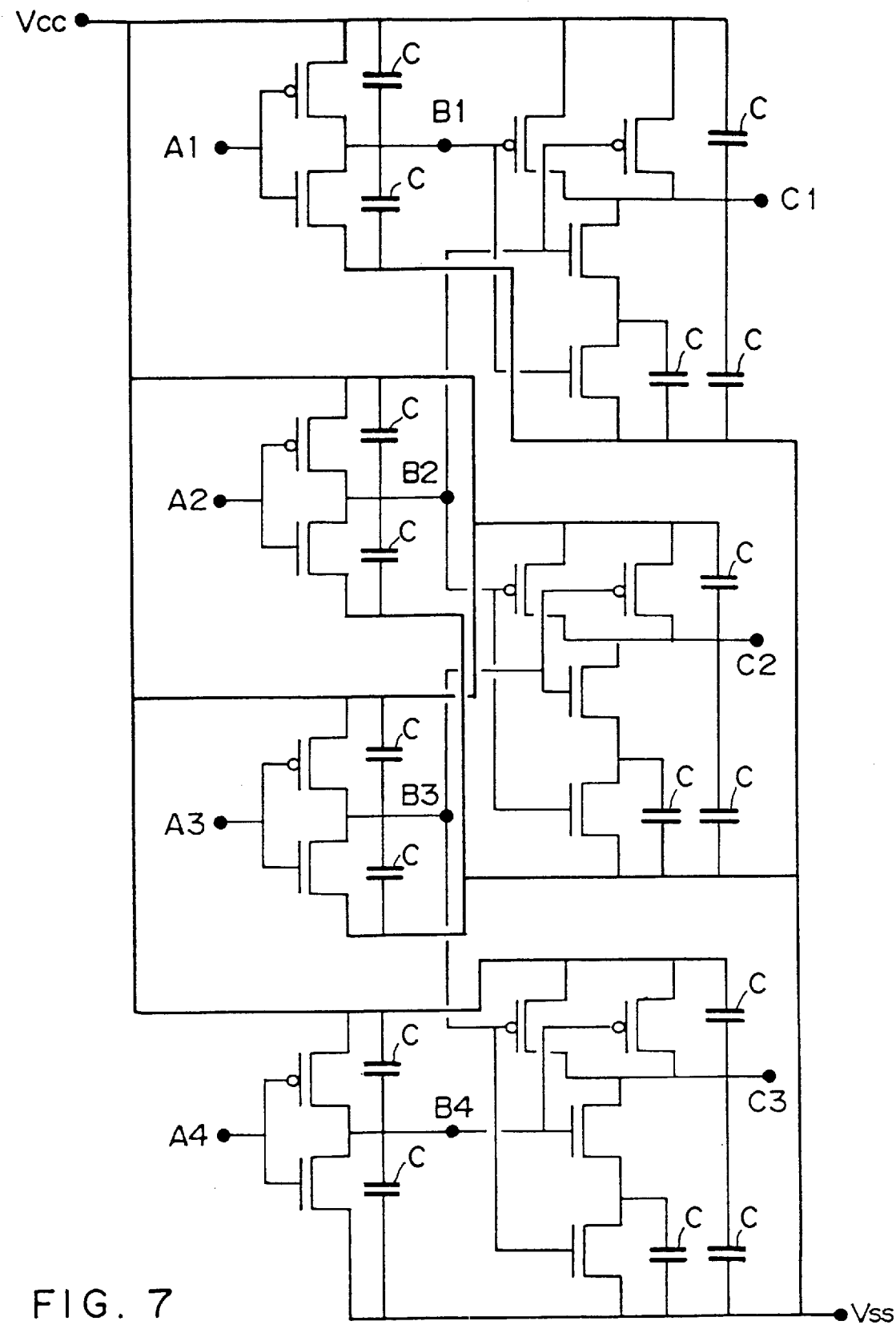
FIG. 7 shows a diagram showing a CMOS-FET circuit that is an object of analysis in this embodiment.

FIG. 7 is a diagram showing a CMOS-FET circuit that is an object of analysis of this embodiment.

In this figure, the transistors with circles at the gates are N-channel type MOS transistors; the other transistors are P-channel type MOS transistors. A1, A2, A3, A4, B1, B2, B3 and B4 are the gate input signals (signals at the input nodes). C1, C2 and C3 are the signals output to the outside (the signals at the output nodes). C is the parasitic capacitance. Vcc is a fixed voltage source, for example +5 V. VSS is GND, for example a ground terminal.

In the event-driven method, the effect of node potential changes is transmitted between blocks via events. For this reason, if strongly coupled nodes are included in different blocks in the circuit division, not only will many events be generated, causing deterioration in the calculation efficiency, but it will become necessary to generate events under more stringent conditions in order to maintain overall accuracy, causing even further deterioration of the calculation efficiency. For this reason, it is necessary to perform the circuit division in such a way that nodes which are strongly coupled to one another will be included in the same block.

In this embodiment, the circuit division is performed keeping the above two points in mind. In the MOS transistors that comprise the MOS circuit, the transistor gate and source and drain, are insulated from one another. In addition, the gate affects the source and the drain by controlling the channel current by the electrical field effect. For this reason, the signals at gates that are connected to different nodes tend to vary at different rates. Consequently, in this embodiment the circuit is divided into blocks at the MOS transistor gates. In addition, the connections to the Vcc and Vss fixed voltage sources are cut off, so that they do not belong to any block.

Figure 8:
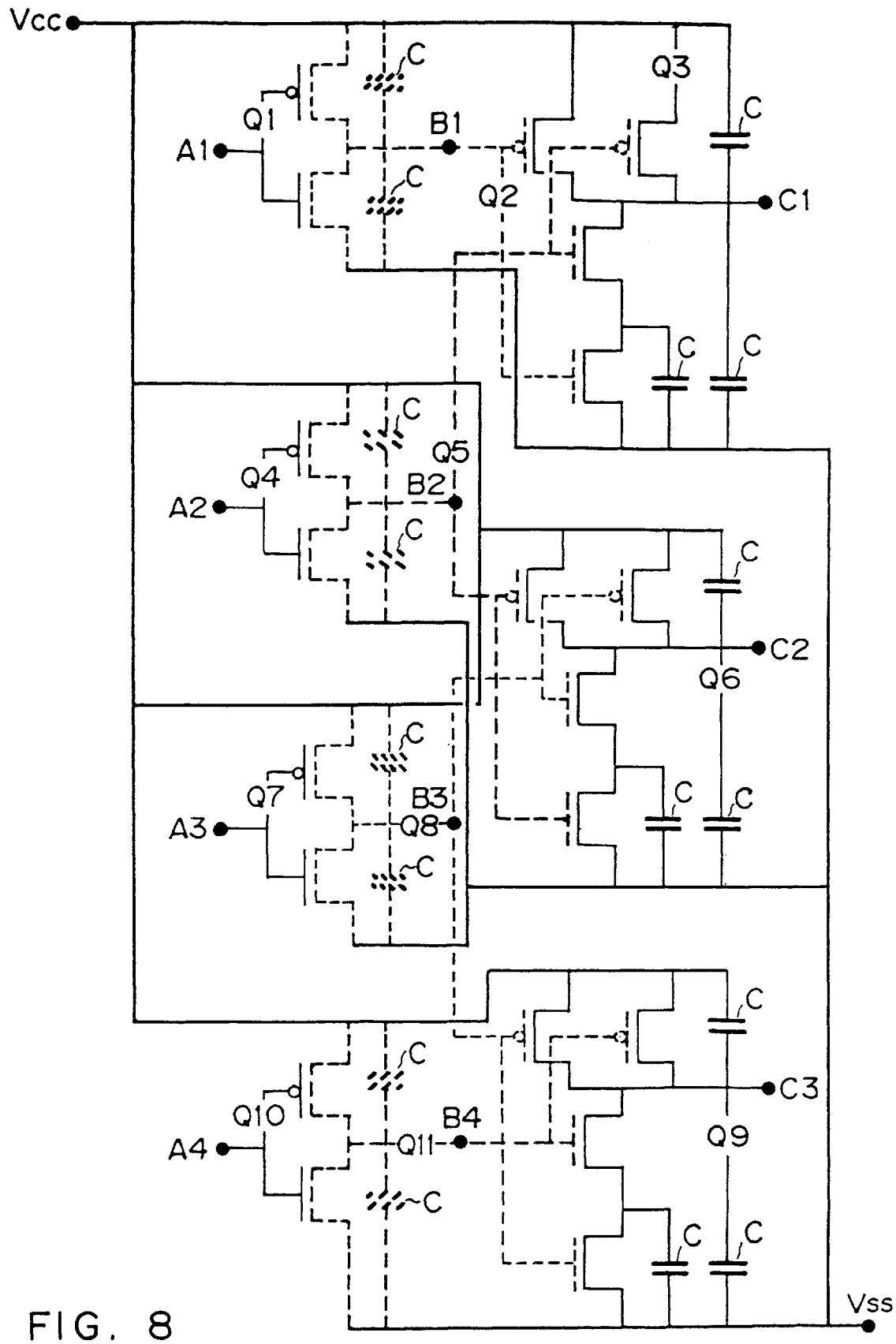
FIG. 8 shows a diagram showing the division of the circuit shown in FIG. 7 into a plurality of blocks.

FIG. 8 is a diagram in which the circuit shown in FIG. 7 has been divided into several blocks by the method described above. In this figure, the nodes belonging to the 11 blocks Q1 to Q11 are distinguished by being shown by lines such as _____, ----- and ⋯ .

Figure 9:
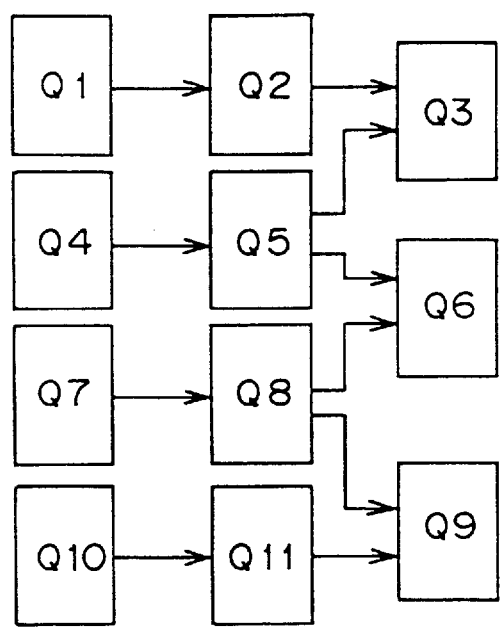
FIG. 9 shows a diagram showing the fan-in and fan-out connections among the blocks Q1 to Q11 shown in FIG. 8.

FIG. 9 is a diagram showing the fan-in and fan-out connection relationships among the blocks Q1 to Q11; the arrow directions correspond to the forward direction of signal flow (the fan-out direction).

The action of the effective block extraction unit shown in FIG. 5 will now be explained referring to the flow chart in FIG. 10. Here, the example shown in FIG. 9 will be considered to make the action easier to understand. The flow chart shown in FIG. 10 is executed under the control of the data control section 100.

First, the path search section 130 selects one output node to be the object of the simulation from the output object node list storage section 111. Next, the block that contains that node is selected and its name is stored in the effective block list storage section 114 as an effective block of depth "0". In this case if a node that is an object of simulation does not exist, the processing is ended (step S1).

For example, C1 might be selected as the node that is to be the object of output; then the block Q3 which includes the C1 is registered in the effective block list 114 as an effective block of depth "0".

Next, the path search section 130 searches for adjacent blocks connected to the registered block as effective blocks, referring to the net list stored in the net list storage section 112 (step S2).

Then, if there is such a adjacent block, the name of that block is output to the depth judgment section 140. If there is a plurality of such adjacent blocks, only one of those blocks is selected and the blocks other than that selected block are stacked in the stack 115 (step S3).

For example, if the block Q2 is selected, then the block Q5 will be stacked in the stack 115.

Meanwhile, if there is no adjacent block, the path selection section 130 fetches a block from the stack 115 and transfers that block to the depth judgment section 140 as the selected block (step S4, yes). If there is no block in the stack 115, then the flow returns to the step S1.

The depth judgment section 140 finds the depth of the selected block received from the path search section 130. That is to say, if the selected block is a fan-in block for the block that is the parent of that selection (referred to hereafter as the parent block) (the output node of that selected block becomes the input node of the parent block), then the depth of the selected block is taken to be equal to the depth of that parent block. In addition, conversely, if the selected block is a fan-out block (the input node of that selected block becomes the output node of that parent block), then the depth of the selected block is taken to be 1 more than the depth of that parent block. Then the depth is output to the effective block judgment section 150. The effective block judgment section 150 compares the input depth to the specified depth stored in the specified depth storage section 113 (depth within the standard); if the input depth is equal to or less than the specified depth (step S5, depth within the standard), then the selection block next investigates whether or not the path search is being executed for that block for the first time (whether the block depth is as yet unspecified). Meanwhile, if the depth of the selected block is larger than the specified depth (step S5, depth outside of standard), then the effective block judgment section 150 ends the processing for this selected block, and returns to step S4 above.

Thus, since the block Q2 is the fan-in block for the parent block Q3, the depth judgment section 140 judges the block Q2 to be a block of depth "0", the same as the parent block Q3. Then, since the depth of the block Q2 has not yet been determined, that depth "0" is output to the effective block judgment section 150.

Thus, since the depth of the block Q2 is equal to or less than the specified depth, the effective block judgment section 150 judges the block Q2 to be an effective block, and stores it in the effective block list storage section 114 (step S8).

Meanwhile, if, in the above step S6, it is found that the selected block is one for which a path search has already been executed and a depth has been set, then the effective block judgment section 150 compares the depth previously determined for the selected block (the old depth) to the depth newly found in step S5 above (the new depth). Then, if the two are equal or the new depth is larger than the old depth, the processing for that selected block is ended (step S7, old depth</=new depth) and the flow returns to step S4.

Meanwhile, in the step S7, if old depth>new depth, that new depth is taken as the new depth of the selected block, the selected block is taken as the effective block with the new depth, and its name is stored in the effective block list storage section (step S8).

After the processing of the step S8 is completed, the flow returns to the step S2 above, and a search is conducted for the next block connected to the selected block.

Thus, in step S7, for a block for which path searches are conducted several times, the smallest depth is taken to be the depth of that block (the fan-out level depth).

By repeating the processing in steps S1 to S8 above, the effective blocks can be selected from among all of the blocks in the circuit, and the names of the effective blocks stored in the effective block list storage section 114.

That is to say, according to the above description, after the depth of the block Q2 has been found, the blocks Q3 and Q1, which are connected to the block Q2, are listed up in the processing step S2. Then, for example, the block Q1 is selected, and the block Q3 is stacked in the stack 115 (step S3).

Next, since the block Q1 becomes the fan-in block with respect to the parent block Q2, the depth of the block Q1 becomes "0" (step S5). Then, via the steps S6 and S8 above, the depth of the block Q1 is taken to be "0", and Q1 is stored in the effective block list storage section 114.

Next, the block Q2 is selected as a block that is adjacent to the block Q1. Since the block Q2 is the fan-out block for the parent block Q1, its depth is 1 more than the depth "0" of the block Q1, in other words, "1". However, a path search has already been conducted for the block Q2, and it has been registered as an effective block of depth "0" in the effective block list storage section 114. For this reason, after the step S6, in step S7 it is judged that the new depth "1" is equal to or greater than the old depth "0", and the flow proceeds to step S4.

Next, in the step S4, the block Q3 is fetched from the stack 115. Since the block Q3 is stacked in the stack 115 as the fan-out block of the block Q2, its depth becomes "1" (step S5), but, as in the case of the block Q2, it has already been registered in the effective block list storage section 114 as a block of depth "0", so the previously determined depth takes priority, and the flow proceeds to step S4 without the depth being changed.

Next, the block Q5 is fetched from the stack 115; since the block Q5 is the fan-in block for the parent block Q3, its depth is found to be "0" (step S5), and, through steps S6 and S8, it is stored in the effective block list storage section 114 as an effective block of depth "0".

Next, in step S2, the blocks Q4, Q3 and Q6 are listed up as blocks that are connected to the block Q5; for example, the block Q4 can be selected and the remaining blocks Q3 and Q6 stacked in the stack 115 (step S3).

Since the block Q4 is the fan-in block with respect to the parent block Q5, its depth is found to be "0" (step S5); and in steps S6 and S8 it is listed in the effective block list storage section 114 as an effective block of depth "0".

Next, the block Q5 is again selected as a block that is connected to the block Q4 (step S2); after it has been processed through the steps S3 to S6 in the same manner as the block Q2, in step S7 it is judged that the new depth ("1") is equal to or greater than the old depth ("0"), the flow returns to step S4, and the block Q3 is fetched from the stack 115. Since this block Q3 has already been registered in the effective block list storage section 114 as an effective block of depth "0", it is processed in the same manner as the block Q5.

Next, the block Q6 is fetched from the stack 115 in step S4. This block Q6 is the fan-out block for the parent block Q5 that has been registered as a block of depth "0", so its depth is found to be "1" (step S5). Then, since a path search has not yet been executed for the block Q6 (step S6, not yet), the block Q6 is registered in the effective block list storage section 114 as an effective block of depth "1" (step S8).

Next, the flow returns to step S2, and the block Q5 and the block Q8 are listed up as blocks connected to the block Q6. For this purpose, first the block Q5 is selected and the block Q8 is stacked in the stack 115 (step S3).

Next, step S5 is executed; since the block Q5 is the fan-in block with respect to the parent block Q6, its depth becomes "1", but according to similar processing as that described above, through steps S6 and S7, the flow returns to step S4 with the depth of the block Q5 remaining at "0". Then the block Q8 is fetched from the stack 115.

Since the block Q8 is the fan-in block for the parent block Q6, its depth is found to be "1" that is equal to the depth of the parent block Q6 (step S5). Since a path search has not yet been executed for the block Q8 (step S6, not yet), the block Q8 is registered as an effective block of depth "1" (step S8).

Subsequently, through similar processing, the block Q7 is stored in the effective block list storage section 114 as an effective block of depth "1". Since the block Q9 is the fan-out block for the parent block Q8, its depth is found to be "2". In this case, since the specified depth is "1", this block Q9 is not registered as an effective block, and the flow returns to step S4.

As a result of the above processing, the blocks Q1 to Q5 are registered in the effective block list storage section 114 as effective blocks of depth "0", and the blocks Q6 to Q8 are registered as effective blocks of depth "1".

Figure 11:
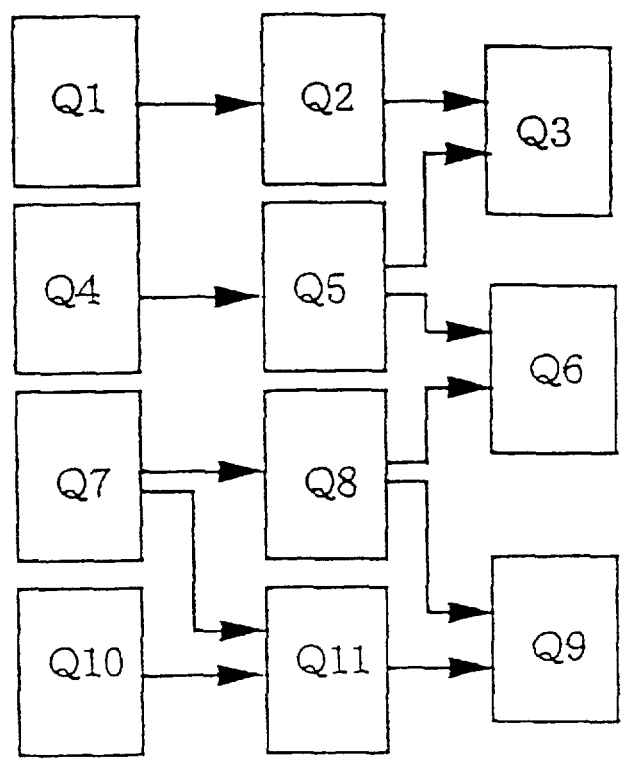
FIG. 11 shows a diagram showing another example of circuit division.
Figure 12:
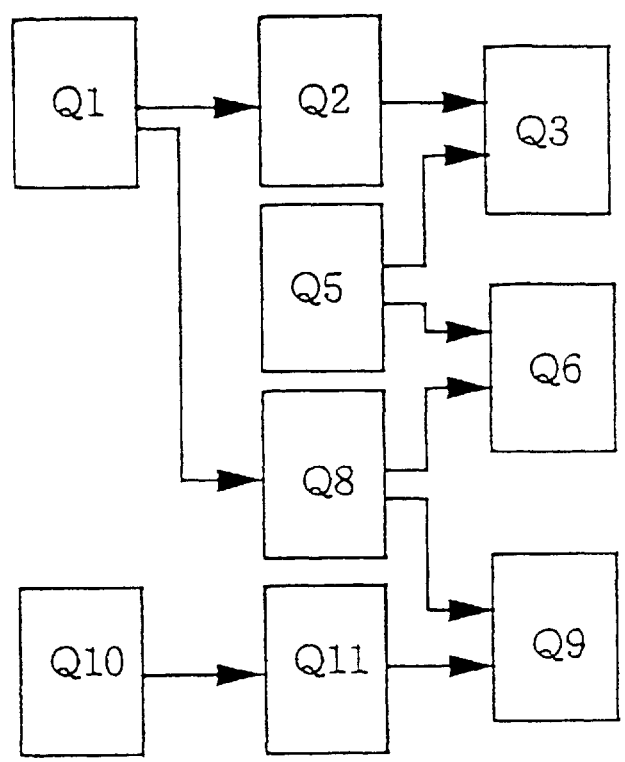
FIG. 12 shows a diagram showing still another example of circuit division.

FIG. 11 and FIG. 12 show other examples of circuit division. In both of these figures, as in FIG. 9 above block Q3 is taken to be the block that includes the object node, and if in addition the specified depth is to be "1", the effective blocks are as follows.

1. The case shown in FIG. 11

Effective blocks of depth "0": blocks Q1 to Q5

Effective blocks of depth "1": Q6 to Q8

In this case, the blocks Q7 and Q8 are found to have new depths of "2" in step S5 in the second path search in the flow chart in FIG. 10, but it is judged that new depth>/=old depth in step S7 so that finally these blocks are registered in the effective block list storage section 114 as effective blocks of depth "1". The blocks Q9 to Q11 have depths of "2", so they are not registered as effective blocks.

2. The case shown in FIG. 12

Effective blocks of depth "0": blocks Q1 to Q3 and Q5

Effective blocks of depth "1": blocks Q6 and Q8

In this case, the blocks Q9 to Q11 have depths of "2", so they are not registered as effective blocks.

Figure 13:
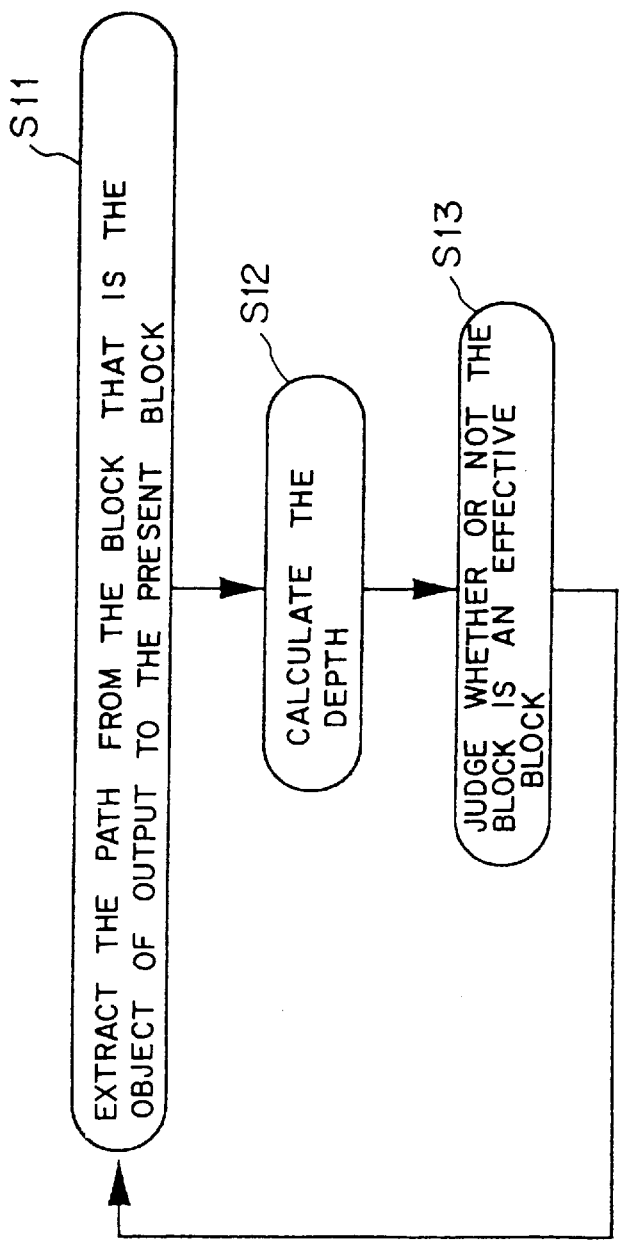
FIG. 13 shows a flow chart explaining another embodiment of a method to extract effective blocks.

Next, FIG. 13 is a flow chart that explains another embodiment of an effective block extraction method.

In this second method, first, as in the method described above, the blocks are selected one at a time based on block division circuit information, and all paths from the block that is the object of the simulation result output to the selected block are extracted (step S11).

Next, by, for example, a method similar to that in the embodiment described above, the depth of that selected block is calculated (step S12).

Next, based on that depth, it is judged whether or not the selected block is an effective block. If it is an effective block, then the name of that effective block is stored in memory (step S13).

By executing the processing in the above steps S11 to S13 for all blocks in the circuit except for the block that is the object of analysis, the effective blocks are extracted from the circuit that is the object of simulation.

Figure 14:
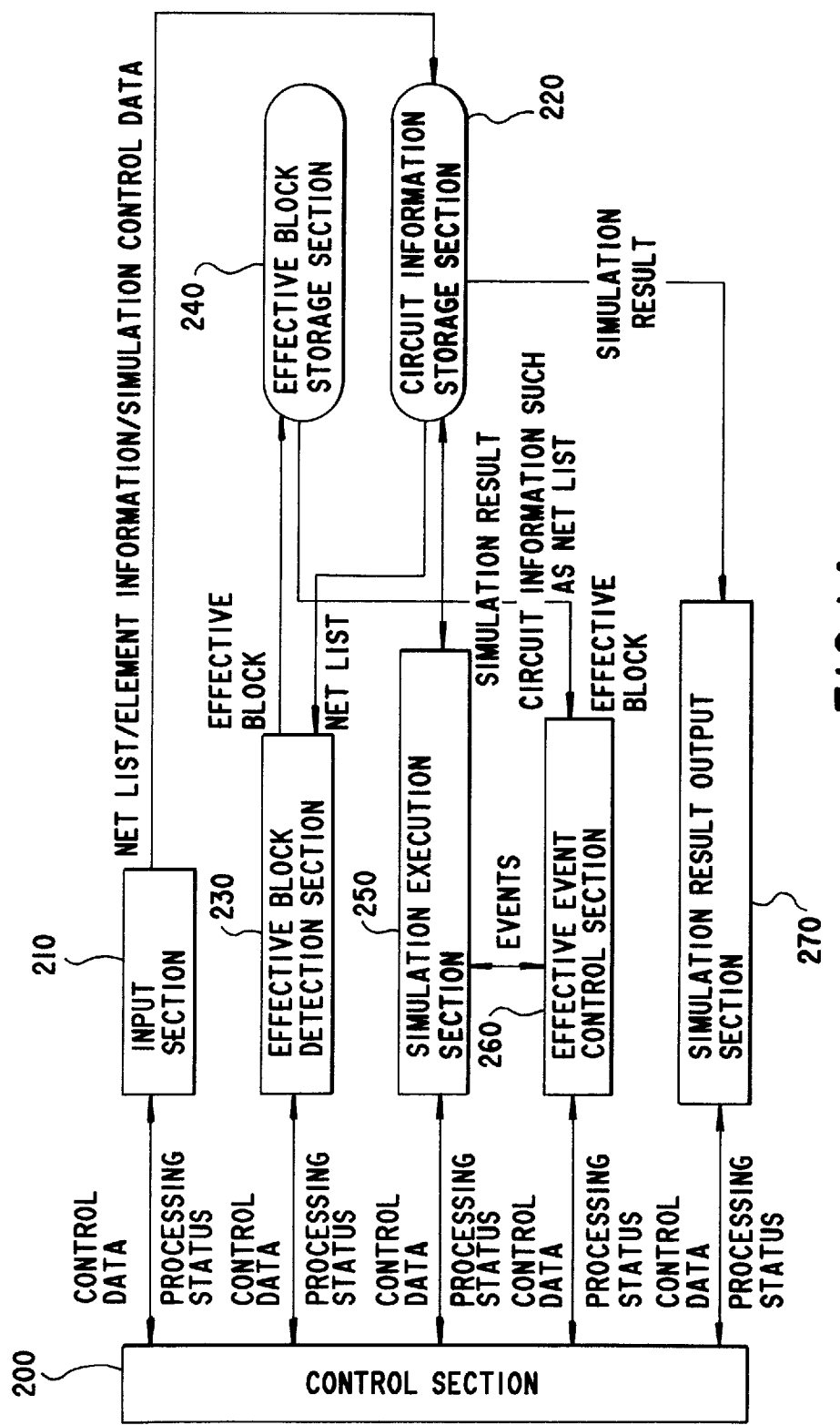
FIG. 14 shows a diagram showing an example of the configuration of a circuit simulator that executes circuit simulations by the event-driven method.

One example of the configuration of a circuit simulator that executes circuit simulations by the event-driven method using the effective blocks extracted by the above-described first or second effective block extraction method is shown in FIG. 14.

This circuit simulator executes transient analysis by the circuit-driven method.

Here, the essentials of transient analysis by the event-driven method is explained.

In the event-driven method, an event is defined as, "a signal that provides notice of the time at which the anticipated potential at internal nodes subsequent to a block should be recalculated".

Here, the method of calculating the anticipated potential change at a node after a block has received an event is explained.

When a block receives an event, first the potentials at the internal nodes are calculated by the negative integration method. Then the time at which the cutoff error will be within a prescribed standard is predicted. This predicted time is estimated from the error in the previous internal error calculation time.

Next, the electrical potentials at the internal nodes are calculated by the negative integration method and the Newton-Raphson method. In this calculation, electrical potential information at nodes external to the block at the predicted time is necessary; values found from the external node prediction formula for each block are used as these values.

Next, the accurate cutoff errors at this time are calculated. If these cutoff errors are within the prescribed standard value, these results for the node potential are used. In contrast, if there exists even one node at which the standard value is exceeded, a new predicted time at which the cutoff error will be within the standard value is calculated, the internal node calculation at this new time is repeated, and the cutoff errors are rechecked. Thus, the time prediction and electrical potential calculation are repeated until the cutoff error is finally within the prescribed standard value.

The above results are then interpolated to obtain a predictive formula that shows change of the internal node potentials at times after the event is received.

There are two types of events. One type is an event affecting the same block in which it occurs; the other type affects the fan-out block.

An event that is sent to a location within the same block in which it occurs is generated for the purpose of suppressing the cutoff error of the node potential calculation within the block and keeping it within the standard value, and is called a self-control event. In the internal block node potential calculation, this type of event is generated at the time when the calculation result is finally within the standard value, and then is sent to locations within the same block.

Meanwhile, an event that affects the fan-out block transmits information that the predicted potential within the block has changed, and is called a prediction correction event. The internal node potential in a block is calculated using the predicted electrical potential in the fan-in block; as the simulation proceeds, an error occurs between the predicted potential used in the calculation and the actual electrical potential. If this error is over the standard value, a prediction correction event is sent to a block where the calculation is being done using the old predicted potential.

When an event is generated in the circumstances described above, it is first sent to the event queue. In the event queue, whether that event is valid or not is investigated. If an event that arrives is a prediction correction event, the time is compared with that of self-control events sent from within the same block and also stacked in the event queue; if the time of the newly sent event is late, then the prediction correction event is discarded.

Meanwhile, if the newly arrived event is a self-control event, then events sent within the same block, except for this event, are all deleted from the event queue. This is because, in any case, in a new electrical potential calculation triggered by a self-control event the new predicted values in the fan-in blocks are used, so that events generated based on the old predicted value become meaningless.

New events that remain, without being deleted, are stacked in the event queue in order of time. At specified times, these events are taken from the event queue and sent to the target block.

Next, we explain the configuration of the circuit simulator shown in FIG. 14.

The control section 200 controls the entire system.

The input section 210 is a device for the purpose of external input of information that is necessary for transient analysis circuit simulation by the event-driven method of, for example, a net list, element information, simulation control data, etc.

The circuit information storage section 220 is a memory that stores the information input from the input section 210, and at the same time stores the simulation results.

The effective block detection section 230 has a function similar to that of the effective block detection unit shown in FIG. 5 above; it receives input of circuit configuration information on the circuit that is the object of simulation from the circuit information storage section 220, and extracts effective blocks from the circuit by the method described above.

The effective block storage section 240 is a memory that stores the list of effective blocks detected by the effective block detection section 230.

The simulation execution section 250 reads out information necessary for the simulation from the circuit information storage section 220, and executes a transient analysis circuit simulation by the event-driven method based on the said information. When an event is generated, the simulation execution section 250 sends that event to the effective event control section 260.

When the effective event control section 260 receives an event from the simulation execution section 250, it judges whether or not the block to which that event is sent is an effective block, based on the effective block information stored in the effective block storage section 240. Then it returns the result of that judgment to the simulation execution section 250.

When the simulation execution section 250 receives the judgment result from the effective event control section 260, it executes the simulation using only the events that are sent to effective blocks. Then that simulation result is stored in the circuit information storage section 220.

The simulation result output section 270 reads out the simulation result from the circuit information storage section 220, and prints that information or displays it on a screen, through, for example, a printer or display.

Figure 15:
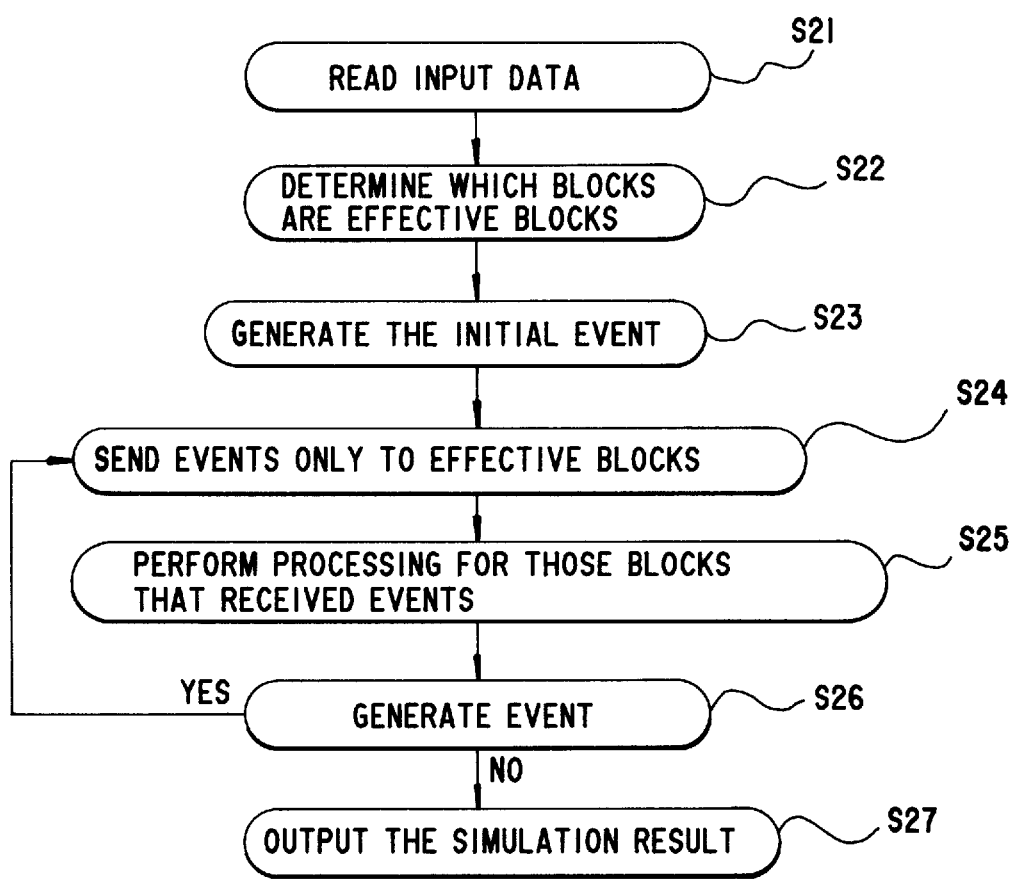
FIG. 15 shows a flow chart explaining circuit simulation in transient analysis by the event-driven method that is executed by the circuit simulator shown in FIG. 14.

FIG. 15 is a flow chart explaining the contents of the transient analysis circuit simulation processing by the event-driven method that is executed by the circuit simulator shown in FIG. 14.

First, the effective block detection section 230 reads out the input data (net list etc.) input through the input section 210 from the circuit information storage section 220 (step S21).

Next, from the blocks in the circuit defined by the input data, the blocks that are effective with respect to the block that is the object of analysis are determined by the method described above, and these effective blocks are stored in the effective block storage section 240 (step S22).

Next, the simulation execution section 250 reads out the information necessary for the simulation from the circuit information storage section 220, and first generates the initial event. Then the execution of the simulation by the event-driven method (event-driven simulation) is started (step S23).

Subsequently, the simulation execution section 250 generates events one after another, and proceeds with the event-driven simulation. In this case, every time an event is generated, the simulation execution section 250 inquires of the effective event control section 260 whether or not the block to which that event is sent is an effective block. Then the events are sent only to the effective blocks (step S24).

The simulation execution section 250 executes the simulation processing, for example the calculation of the predicted electrical potential after the time at which an event is received, for the block that receives the event (step S25).

Then a new event is generated based on the result of the simulation processing (step S26).

The simulation execution section 250 repeats the processing in the above steps S24 to S26 until there are no more newly generated events (step S26, none). Then, when the simulation ends, the result is stored in the circuit information storage section 220. The simulation result stored in the circuit information storage section 220 is output to outside by the simulation result output section 270 (step S27).

Thus, in this embodiment, since only events directed to effective blocks are sent, circuit simulation can be done at high speed. In addition, the simulation analysis precision can be easily adjusted by varying the depth.

In the embodiment described above, only one node is specified as being the object of analysis, but this invention is not so limited; it is possible to specify a plurality of nodes as objects of analysis. In addition, the circuit that is the object of analysis does not have to be a CMOS circuit; this invention is also applicable to other types of semiconductor integrated circuits such as NMOS circuits and PMOS circuits.

As explained above, this invention extracts blocks including nodes that affect the simulation accuracy at the node that is the object of analysis as effective blocks. Since events are only sent to effective blocks in circuit simulation by the event-driven method, simulation can be done at high speed. Consequently, this invention will greatly contribute to shortening the development time for circuit design of semiconductor integrated circuits.

What is claimed is:

1. An effective block extraction apparatus for extracting effective blocks that receive events from a circuit that is an object of an event-driven circuit simulation, comprising:

depth judging means for finding a depth of the fan-out level with respect to a block that is an object of analysis including a node that is the object of analysis, for each block in the circuit, based on the number of paths connecting blocks within the circuit in the direction from fan-in to fan-out, among the paths from said block that is the object of analysis to the block that is the object of the depth determination by said depth judging means; and effective block judging means for judging blocks an effect of which on a simulation accuracy at the node that is the object of analysis is at or above a specified level to be effective blocks by comparing the depths of each block found by said depth judging means to a specified standard depth.

2. An effective block extraction apparatus as defined in claim 1, wherein said depth judging means comprise:

path searching means for searching for all paths that connect the blocks within the circuit starting at said block that is the object of analysis, and depth computing means for finding the depth with respect to the block that is the object of analysis for each block in the circuit based on the path information obtained by the said means of path search.

3. An effective block extraction apparatus as defined in claim 2 wherein said depth computing means takes the smallest number to be the depth, if there are a plurality of paths from said block that is the object of analysis to the block that is the object of the depth determination, so that a plurality of numbers of paths connecting blocks in the said direction from fan-in to fan-out are found.

4. A method of extracting an effective block, comprising the steps of:

finding the depth of the fan-out level as a depth for a block to be analyzed including the node to be analyzed, for each block in the circuit, based on the number of paths connecting blocks within the circuit in the direction from fan-in to fan-out, among the paths from said block that is the object of analysis to the block that is the object of the depth determination by said step of finding; and judging a block that effects the node to be analyzed whose simulation precision level is more than a specified level as an effective block by comparing the resultant depth of each block from said step of finding with a specified threshold depth.

5. A circuit simulator that simulates circuits by an event-driven method, comprising:

depth judging means for finding a depth of a fan-out level with respect to a block that is an object of analysis, for each block in the circuit as a depth;

effective block judging means for judging blocks that exert influence on a simulation accuracy at a node that is the object of analysis that is at or above a specified level, by comparing the depth of each block found by the said depth judging means to a specified standard depth;

event generation means for generating events only with respect to blocks that are judged to be effective blocks by said effective block judging means; and simulation executing means for executing the circuit simulation based only on the events generated by said event generating means.

6. A circuit simulator that executes circuit simulations by an event-driven method, comprising:

effective block information inputting means for inputting an information relating to effective blocks that exert influence on the simulation accuracy at a node that is the object of analysis at above a specified level, based on a depth of a fan-out level determined from the number of paths connecting blocks within the circuit in the direction from fan-in to fan-out, among the paths from said block that is the object of analysis to the block that is the object of the depth determination;

effective block information storing means for storing information of said effective blocks input through the effective block information inputting means;

event generating means for generating events only with respect to the effective blocks information on which is stored in said effective block information storing means; and simulating execution that executing means for executing circuit simulations based only on the events generated by said event generating means.

7. A circuit simulator method of simulating circuits by an event-driven method, comprising the steps of:

finding a depth of a fan-out level with respect to a block that is a object of analysis including a node that is an object of analysis, for each block in the circuit as a depth; and judging effective blocks that exert influence on a simulation accuracy at a node that is the object of analysis that is at or above a specified level, by comparing the depth of each block found by the said step of finding to a specified standard depth;

generating events only with respect to blocks that are judged to be effective blocks by said step of judging; and executing the circuit simulation based only on the events generated by said step of generating.

8. A circuit simulator method of executing circuit simulations by an event-driven method, comprising the steps of:

inputting an information relating to effective blocks that exert influence on the simulation accuracy at a node that is the object of analysis at above a specified level, based on a depth of a fan-out level determined from the number of paths connecting blocks within the circuit in the direction from fan-in to fan-out, among the paths from said block that is the object of analysis to the block that is the object of the depth determination;

storing information of said effective blocks input through said step of inputting;

generating events only with respect to the effective blocks information on which is stored in said step of storing; and executing circuit simulations based only on the events generated by said step of generating.

9. A computer-readable storage medium used to direct a computer in extracting an effective block to perform the functions of:

finding the depth of the fan-out level as a depth for a block to be analyzed, including the node to be analyzed, for each block in the circuit, based on the number of paths connecting blocks within the circuit in the direction from fan-in to fan-out, among the paths from said block that is the object of analysis to the block that is the object of the depth determination; and judging a block that effects the node to be analyzed whose simulation precision level is more than a specified level as an effective block by comparing the resultant depth of each block from said step of finding with a specified threshold depth.

10. A computer-readable storage medium used to direct a computer in simulating circuits by an event-driven method, to perform the functions of:

finding a depth of a fan-out level with respect to a block, which is an object of analysis including a node that is the object of analysis, for each block in the circuit, based on the number of paths connecting blocks within the circuit in the direction from fan-in to fan-out, among the paths from said block that is the object of analysis to the block that is the object of the depth determination;

judging effective blocks that exert influence on a simulation accuracy at a node that is the object of analysis that is at or above a specified level, by comparing the depth of each block from said step of finding to a specified standard depth;

generating events only with respect to blocks that are judged to be effective blocks; and executing the circuit simulation based only on the events.

11. A computer-readable storage medium used to direct a computer in executing circuit simulations by an event-driven method, to perform the functions of:

inputting an information relation to effective blocks that exert influence on the simulation accuracy at a node that is an object of analysis at above a specified level, based on a depth of a fan-out level determined from the number of paths connecting blocks within the circuit in the direction from fan-in to fan-out, among the paths from said block that is the object of analysis to the block that is the object of the depth determination;

storing information of said effective blocks;

generating events only with respect to the effective blocks information; and executing circuit simulations based only on the events.

* * * * *